(12) United States Patent
Chang

(10) Patent No.: US 8,142,959 B2
(45) Date of Patent: Mar. 27, 2012

(54) METHOD AND APPARATUS FOR GATING PHOTOMASK CONTAMINATION

(75) Inventor: Chih-Wing Chang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 230 days.

(21) Appl. No.: 12/205,168

(22) Filed: Sep. 5, 2008

(65) Prior Publication Data

US 2010/0062348 A1    Mar. 11, 2010

(51) Int. Cl.
    *G03F 1/00* (2012.01)
(52) U.S. Cl. .............................. 430/5; 430/311; 430/394
(58) Field of Classification Search ............... 430/5, 311, 430/394; 355/53, 75
    See application file for complete search history.

(56) References Cited

U.S. PATENT DOCUMENTS

| 7,450,217 B2 * | 11/2008 | Boogaard et al. ............... 355/53 |
| 2002/0076623 A1 * | 6/2002 | Mori ................................. 430/5 |
| 2003/0095699 A1 * | 5/2003 | Hung et al. .................... 382/149 |
| 2004/0137779 A1 | 7/2004 | Wei |
| 2009/0046281 A1 * | 2/2009 | Straub et al. ............... 356/237.5 |

OTHER PUBLICATIONS http://www.iscid.org/encyclopedia/Hydrophilic, ISCID Encyclopedia of Science and Philosophy, 2001-2005 ISCID.*
Chinese Patent Office, Office Action mailed Nov. 15, 2010, Application No. 200910130393.7, 5 pages.

* cited by examiner

*Primary Examiner* — Mark F Huff
*Assistant Examiner* — Rashid Alam
(74) *Attorney, Agent, or Firm* — Haynes and Boone, LLP

(57) ABSTRACT

A photomask is provided that includes a transparent substrate, a mask pattern formed on a first area of the substrate, the mask pattern having one or more openings that allow light radiation to pass through and having one or more features formed of a first material, and an inspection structure formed on a second area of the substrate different from the first area, the inspection structure being formed of a second material different from the first material.

19 Claims, 4 Drawing Sheets

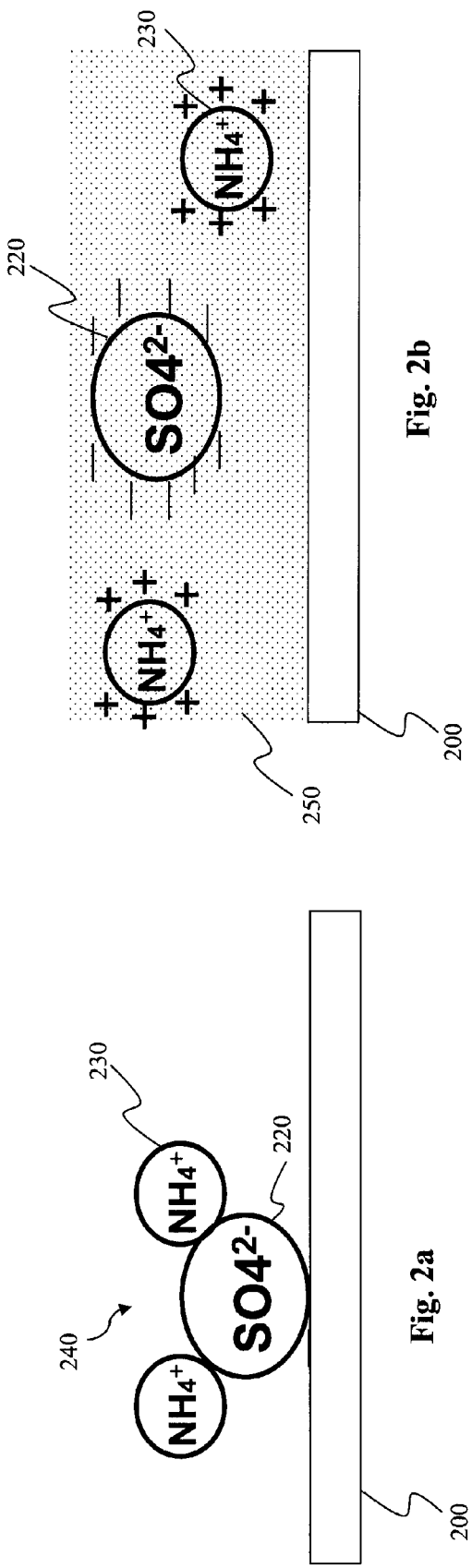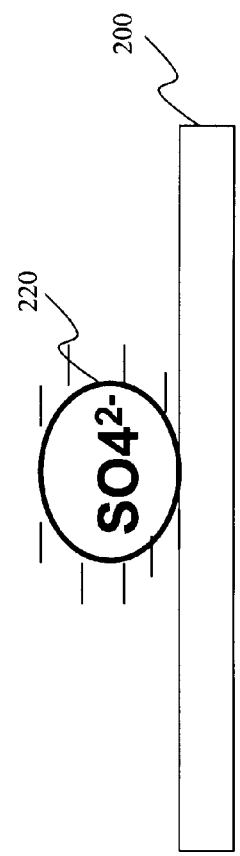

METHOD AND APPARATUS FOR GATING PHOTOMASK CONTAMINATION

BACKGROUND

The present disclosure relates in general to semiconductor manufacturing technology, and more particularly, to a method for gating photomask contamination.

Photomasks, or reticles, are commonly used for photolithography in semiconductor manufacturing. Photomasks are typically made from very flat pieces of quartz or glass with an absorption layer of chromium deposited on one side. The absorption layer may include a pattern that is transferred onto a semiconductor wafer on BIM (Binary Mask) or PSM (Phase Shift Mask) masks during a photolithography process. While contamination of photomasks has always been a problem, high precision masks used in photolithography with wavelengths equal to or less than 248 nm, are particularly susceptible to contamination. One type of photomask contamination is referred to as haze contamination. Haze contamination is a precipitant formed from mask cleaning chemical residual, or impurities of the fab or tool environment cross exposure. For example, when a solution including ammonium ($NH_4$) and sulfate ($SO_4$) is used to clean a photomask, contamination becomes apparent when the photomask is exposed to a short wavelength UV light, such as 193 or 248 nm.

Several methods have been used to detect these and other types of contamination or precipitates on the photomask. Although the methods have been satisfactory for their intended purposes, the methods have not been satisfactory in all respects. For example, one method uses an optical inspection tool to scan an entire surface of the photomask to detect for contamination or precipitates on the photomask. The optical inspection tool may be based on light scanning techniques that utilize various types of light beams such as laser beams or electron beams. However, the optical inspection tool is expensive to own and operate, and scanning the entire surface of a photomask is time-consuming. Accordingly, only a limited number of photomasks can be inspected in a day and a frequency at which the photomask can be inspected is also limited with the optical inspection tool.

Therefore, what is needed is a method and apparatus for gating photomask contamination.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 2a-2c are exploded cross-sectional views of a photomask developing haze contamination;

DETAILED DESCRIPTION

Figure 1:
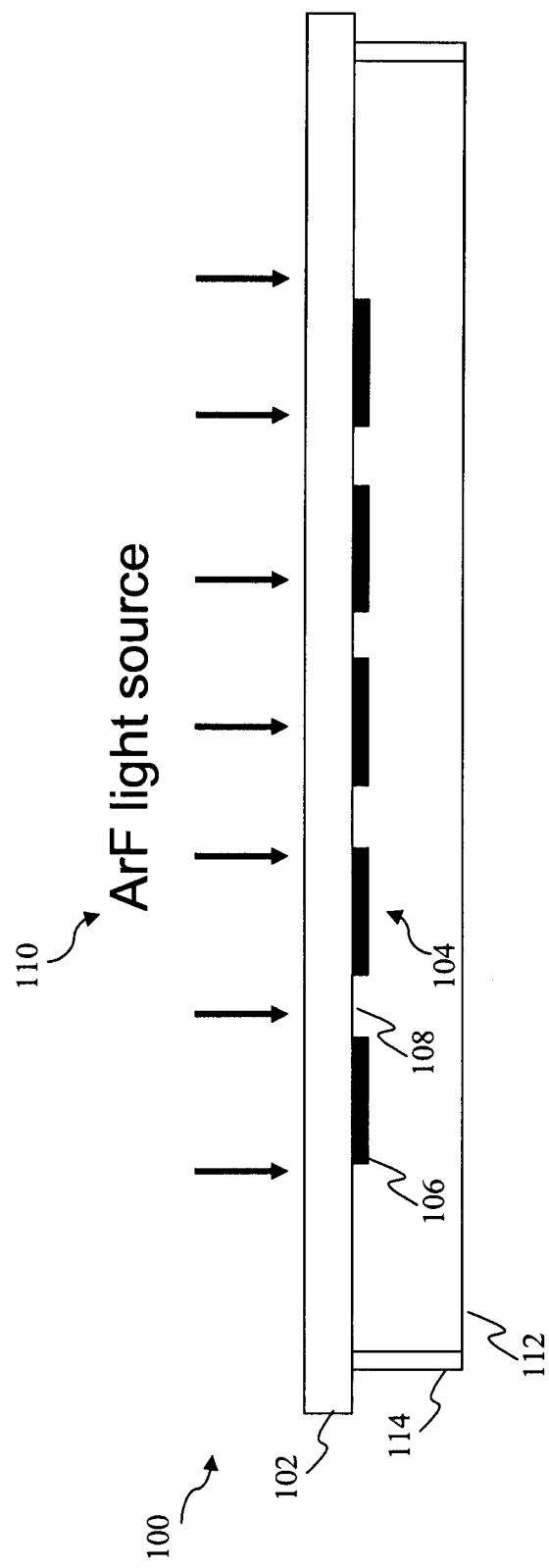
FIG. 1 is a cross-sectional view of a photomask-pellicle system.

It is to be understood that the following disclosure provides different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

FIG. 1 is a cross-sectional view of a mask-pellicle system 100. The system 100 includes a photomask (mask, or reticle, collectively referred to as mask) having a mask substrate 102 and a mask pattern 104 formed on the mask substrate 102. The mask may be utilized in manufacturing a semiconductor wafer. The mask substrate 102 may be a transparent substrate such as fused silica ($SiO_2$), fused quartz, glass, calcium fluoride ($CaF_2$), or other suitable materials relatively free of defects.

The mask pattern 104 on the mask substrate 102 may include one or more features (or absorbers) 106 formed of chromium (Cr) and one or more openings 108. In other embodiments, the mask pattern 104 may include features 106 formed of a metal silicide such as MoSi or $TaSi_2$, metal nitride, iron oxide, inorganic material, other materials such as Mo, $Nb_2O_5$, Ti, Ta, CrN, $MoO_3$, MoN, $Cr_2O_3$, TiN, ZrN, $TiO_2$, TaN, $Ta_2O_5$, $SiO_2$, NbN, $Si_3N_4$, ZrN, $Al_2O_3N$, $Al_2O_3R$, or combinations thereof.

In another embodiment, the mask pattern 104 may include phase shift features formed above, on and/or at least partially in the substrate 102 by etching thereof. The mask pattern 104 may also be a binary intensity mask (BIM or binary mask) including chrome areas and transparent quartz areas. In another embodiment, the mask pattern 104 may be an alternating phase shift mask (AltPSM), employing alternating areas of chrome and 180 degree-shifted quartz. In another embodiment, the mask pattern 104 may be an attenuating phase shift mask (AttPSM), employing an attenuating feature having a phase shift relative to the transparent substrate. Alternatively, the mask pattern 104 may be a chromeless phase shift pattern. In another embodiment, the mask pattern 104 may include a combination of binary features and various phase shift features. Additionally, the mask pattern 104 may include various optical proximity correction (OPC) features designed for fixing an optical proximity affect. The method of forming the mask pattern 104 on the mask substrate 102 may include chemical vapor deposition (CVD), physical vapor deposition (PVD), atomic layer deposition (ALD), plating, and/or other suitable processes.

The features 106 of the mask pattern 104 may be designed to attenuate and/or provide a phase shift to a radiation beam 110 (or radiation energy), and the openings 108 of the mask pattern 104 may be designed to allow the radiation beam to pass through and expose a semiconductor wafer during a lithography patterning process. The radiation beam 110 may include ultraviolet and/or may be extended to include other radiation beams such as deep ultraviolet (DUV), extreme ultraviolet (EUV), or other suitable radiation energy. For example, the radiation beam 110 may include a 193 nm radiation beam from an Argon Fluoride (ArF) excimer laser or a 248 nm beam from a Krypton Fluoride (KrF) excimer laser.

The mask-pellicle system 100 may further include a pellicle 112. The pellicle 112 may include a membrane made of a thin film that is transparent to the radiation beam 110. The pellicle 112 may be secured to a pellicle frame 114. The pellicle frame 114 may be made of a material with sufficient mechanical strength, such as aluminum, and may be designed in a shape and dimension to properly secure the pellicle 112.

It is very important for the mask to be clean and free of any contamination that may have been generated from the fab environment, mask handling/storage, mask fabrication, mask pod out-gassing, pellicle frame residue, pellicle glue, or other semiconductor manufacture process. If there is any type of contamination on the mask, it may cause defects when patterning the semiconductor wafer. One type of mask contamination is referred to as haze contamination. Haze contamination is a precipitant formed from mask cleaning chemical residuals or impurities of the fab or tool environment cross exposure as discussed below. It should be noted that haze contamination is discussed herein as a mere example and that other types of contaminations may be present on the mask that may also adversely affect the patterning process.

Referring to FIGS. 2a-2c, illustrated are exploded cross-sectional views of a mask 200 developing haze contamination. In FIG. 2a, when the mask 200 is cleaned with a cleaning solution based on chemicals such as sulfate and ammonium, residual ions such as sulfate ions ($SO_4^{2-}$) 220 and ammonium ions ($NH_4^+$) 230 may be generated and may combine to form a precipitate 240 such as $(NH_4)_2SO_4$ on the mask 200. In FIG. 2b, the mask 200 may undergo a de-ionized water rinse or other suitable rinse. The mask 200 may be rinsed in de-ionized water 250 that causes the precipitate 240 such as $(NH_4)_2SO_4$ to dissolve into sulfate ions ($SO_4^{2-}$) 220 and ammonium ions ($NH_4^+$) 230. During the rinse, the de-ionized water 250 may be maintained at room temperature and the mask 200 may be rinsed for approximately ten minutes or any other suitable time period. In FIG. 2c, the mask 200 may undergo a drying process following the de-ionized water rinse. The drying process may be conducted with an inert or inactive gas such as nitrogen, oxygen, or argon. However, following the drying process, sulfate ions ($SO_4^{2-}$) 220 may still remain on the mask 200 as is shown in FIG. 2c.

It has been observed that sulfate and ammonium precipitates may be the root causes that lead to crystal growth and haze contamination or formation. Additionally, as the mask 200 is continuously used in a photolithography patterning process, energy from a light source may accelerate the growth of these precipitated defects. For example, with a UV light source of 193 nm wavelength (e.g., ArF excimer laser) or 248 nm wavelength (e.g., KrF excimer laser), precipitated defects can grow and/or deposit upon or near the mask 200. These precipitated defects will limit the usage of the mask and may be large enough to result in printable defects on the semiconductor wafer during photolithography, and thus may lead to low wafer yield.

Several methods have been used to detect these and other types of contamination or precipitates on the mask. For example, an optical inspection tool may be utilized to scan an entire surface of the mask including the mask pattern to detect for contamination or precipitates on the mask. The optical inspection tool may be based on light scanning techniques that utilize various types of light beams such as laser beams or electron beams. However, some of the disadvantages are that the optical inspection tool is expensive to own and operate, and scanning the entire surface of a single mask is time-consuming. Accordingly, only a limited number of masks can be inspected in a day (e.g., low capacity) and a frequency at which the mask can be inspected is also limited with the optical inspection tool. As another example, a wafer inspection tool may be utilized to inspect a pattern imaged or printed on a wafer following a patterning process. In other words, the mask may used in a photolithography process to pattern a control wafer, and the control wafer is inspected for pattern defects to determine whether any contamination or precipitates were present on the mask. However, some of the disadvantages are that the wafer inspection tool is expensive to own and operate, control wafers are used, and there is no early detection of contamination on mask (the contamination or precipitate on the mask has already been printed on the wafer). Therefore, a need exists for a method to monitor a contamination status of a mask that addresses the issues discussed above as well as other issues associated with mask contamination.

Figure 3:
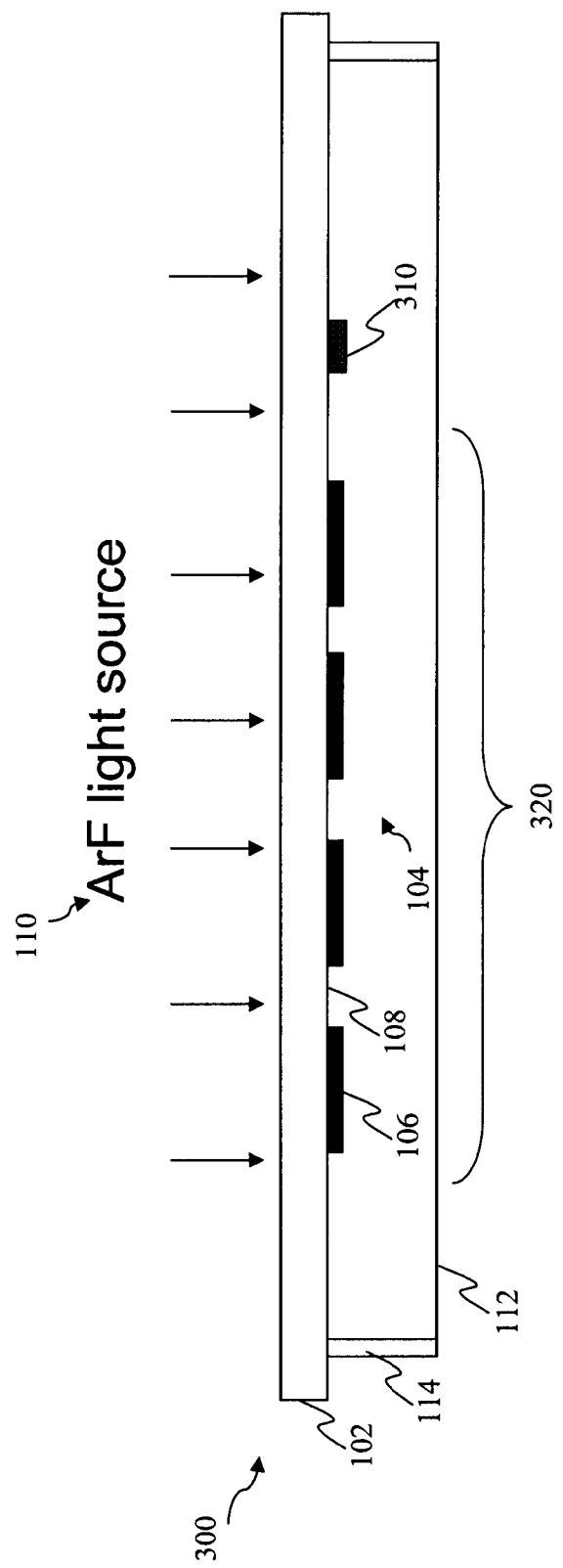
FIG. 3 is a cross-sectional view of a photomask-pellicle system according to various aspects of the present disclosure.

Now referring to FIG. 3, illustrated is a cross-sectional view of a mask-pellicle system 300 according to various aspects of the present disclosure. The mask-pellicle system 300 may be similar to the mask-pellicle system 100 of FIG. 1 except for an inspection structure 310 that may be used to monitor a contamination status of the mask-pellicle system 300. Similar features in FIGS. 1 and 3 are numbered the same for the sake of clarity. The system 300 may include a photomask (mask, or reticle, collectively referred to as mask) having a mask substrate 102 and a mask pattern 104 formed on the mask substrate 102. The mask substrate 102 may be a transparent substrate such as fused silica ($SiO_2$), fused quartz, glass, calcium fluoride ($CaF_2$), or other suitable materials relatively free of defects.

The mask pattern 104 on the mask substrate 102 may include one or more features (or absorbers) 106 formed of chromium (Cr) and one or more openings 108. In other embodiments, the mask pattern 104 may optionally include features 106 formed of a metal silicide such as MoSi or $TaSi_2$. The features 106 of the mask pattern 104 may be designed to attenuate and/or provide a phase shift to a radiation beam 110 (or radiation energy), and the openings 108 of the mask pattern 104 may be designed to allow the radiation beam to pass through and expose a semiconductor wafer during a lithography patterning process. The radiation beam 110 may include ultraviolet and/or may be extended to include other radiation beams such as deep ultraviolet (DUV), extreme ultraviolet (EUV), and other suitable radiation energy. For example, the radiation beam 110 may include a 193 nm radiation beam from an Argon Fluoride (ArF) excimer laser or a 248 nm beam from a Krypton Fluoride (KrF) excimer laser. The mask pattern 104 may be formed on an area 320 that is transferred or printed onto the semiconductor wafer to form an integrated circuit.

The system 300 may further include the inspection structure 310 formed on the substrate 102 within the frame cell. The inspection structure 310 may be located outside the area 320 (of the mask pattern 104) of the substrate 102 such that an image of the inspection structure 310 is not printed on an integrated circuit region of the semiconductor wafer during a photolithography process. The inspection structure 310 may include various shapes such as a square, rectangle, L-shape, T-shape, other polygons, oval, circle, or other suitable shape. A size of the inspection structure 310 may vary depending on the design specifications of the mask. Further, although a single inspection structure is shown, it is understood that two or more inspection structures may be formed at various locations on the substrate 102 within the frame cell as well.

The inspection structure 310 may be formed of a material that is different from the features 106 of the mask pattern 104 and more likely to attract contamination or precipitates (e.g., high precipitate material) during various semiconductor processes with the mask. That is, the inspection structure 310 may be formed of a material that is more prone to develop contamination or precipitates than the other features of the mask. In one embodiment, the inspection structure 310 may include silver. In another embodiment, the inspection structure 310 may include titanium dioxide ($TiO_2$). In yet another embodiment, the inspection structure 310 may further include a hydrophilic material. In still another embodiment, the inspection structure 310 may include a porous carbon material. Moreover, the inspection structure 310 may be formed of various combinations of the materials discussed herein.

The method of forming the inspection structure 310 may depend on the type of material used for the inspection structure. For example, a physical vapor deposition (PVD or sputtering) or other deposition technique may be utilized to form a film of silver or $TiO_2$, and a patterning process such as photolithography and etching may be performed to form the inspection structure 310. In another embodiment, the inspection structure 310 may be formed by a mask writing technique such an ion beam writing process with the porous carbon material. The inspection structure 310 may serve as a reference for monitoring a contamination status of the mask as will be discussed herein below.

Figure 4:
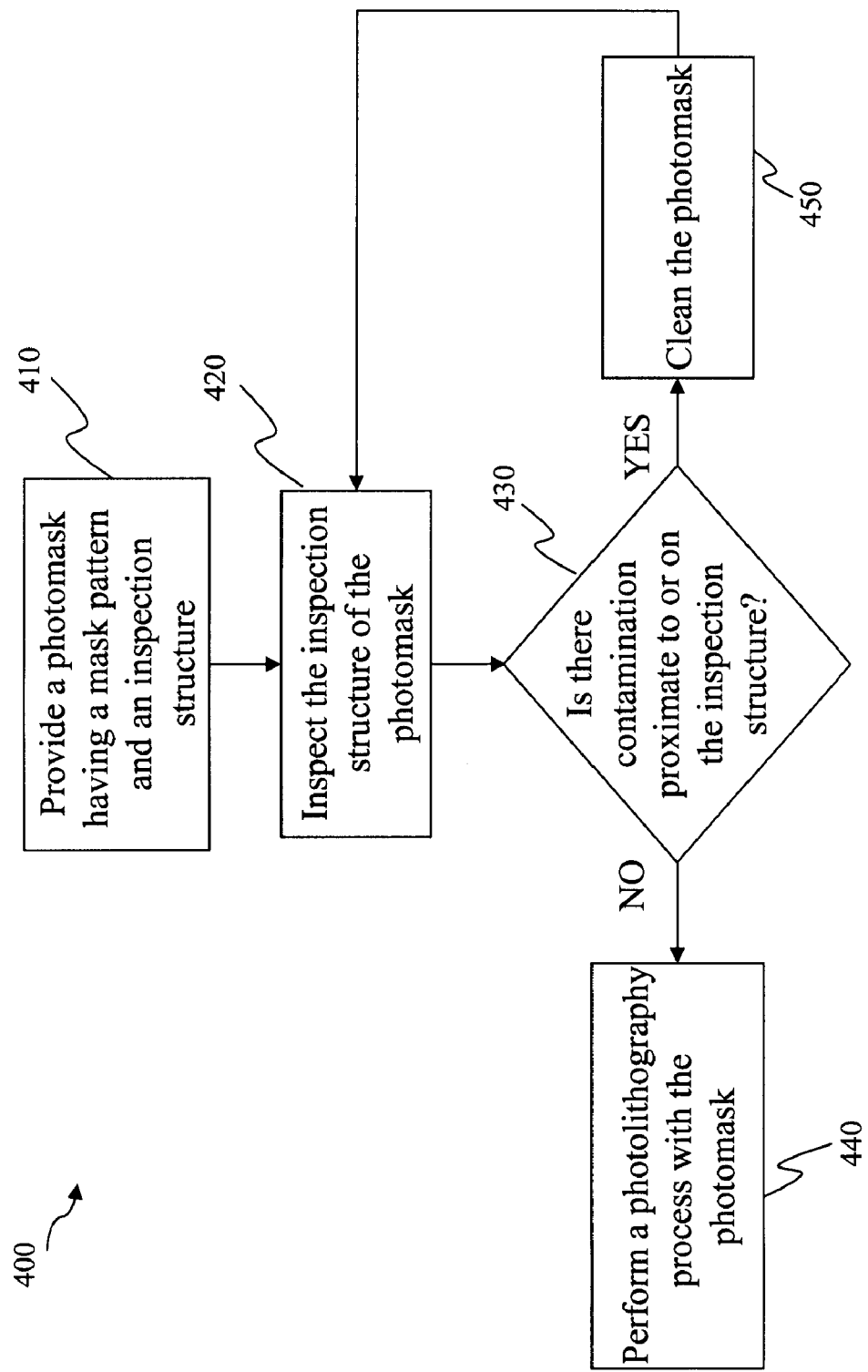
FIG. 4 is a flowchart of a method for monitoring a contamination status of a photomask according to various aspects of the present disclosure.

Now referring also to FIG. 4, illustrated is a flowchart of a method 400 for monitoring a contamination status of a photomask. The method 400 includes block 410 in which a photomask may be provided. The photomask may be similar to the photomask of FIG. 3 including a mask pattern and an inspection structure. The method 400 continues with block 420 in which the inspection structure of the photomask may be inspected for contamination or precipitates. The inspection of the photomask may be part of a scheduled mask inspection routine, or may be performed prior to using the photomask in a semiconductor process, or may be performed after using the photomask in a photolithography process. The inspection of the inspection structure of the mask may be performed by an optical microscope system (or other suitable optical imaging system) to determine whether there is any contamination proximate to or in contact with the inspection structure. It should be noted that the optical microscope system used here may costs less than the optical inspection tool and wafer inspection tool discussed above since the inspection is on the inspection structure and not the entire surface of the mask or wafer. The inspection structure may be used as a reference structure for monitoring a contamination status of the mask. That is, the inspection structure (made of a material that is prone or more likely to develop contamination) is used to determine whether the mask is contaminated or not contaminated. Further, by inspecting the inspection structure located at a specific area on the substrate to determine the contamination status of the mask, inspection of the entire surface of the mask including the mask pattern is not required As such, the time it takes for inspecting the mask is greatly reduced, and thus the number of masks that can be inspected daily is increased (e.g., high capacity) and the frequency at which the mask can be inspected is also increased.

The method 400 continues with block 430 in which a determination is made as to whether there is any contamination or precipitates proximate to or in contact with the inspection structure as discussed in block 420. If it is determined that there is no contamination or precipitates proximate to or in contact with the inspection structure (e.g., status of the mask is not contaminated), the method 400 continues with block 440 in which the mask may be used in a semiconductor process such as a photolithography process to pattern a semiconductor wafer.

If it is determined that there is contamination or precipitates proximate to or in contact with the inspection structure (e.g., status of the mask is contaminated), the method 400 continues with block 450 in which the mask may cleaned to remove the contamination or precipitates. The cleaning may include a cleaning process with a chemical cleaner. The chemical cleaner may be a mixture of sulfuric acid ($H_2SO_4$) and hydrogen peroxide ($H_2O_2$) (commonly known as sulfuric peroxide mix (SPM)) which is used to remove organic particles or native oxides on the mask. In this cleaning process, the SPM may be maintained at a temperature of about 90° C. and the mask may be cleaned for approximately ten minutes. The mask may then undergo a rinsing process. The rinsing process may include a hot de-ionized water (DIW) rinse and/or a cold de-ionized water (DIW) rinse. The hot DIW rinse uses de-ionized water maintained at a temperature of about 60° C. and the mask rinsed for a period of time such as ten minutes. The cold DIW rinse uses de-ionized water maintained at about room temperature and the mask rinsed for a period of time such as ten minutes. It is understood that the temperatures and time periods disclosed herein are mere examples and that other temperatures and time periods may be employed.

The mask may undergo another cleaning process with another chemical cleaner. The chemical cleaner may be a mixture of ammonium hydroxide ($NH_4OH$) and hydrogen peroxide ($H_2O_2$) (commonly known as an SC-1 or APM cleaning solution) which is used to remove inorganic particles on the mask. The SC-1 cleaning solution may be maintained at a room temperature and the mask cleaned for approximately ten minutes. Alternatively, the SC-1 cleaning process may optionally be used in combination with megasonic waves. It is understood that the cleaning process discussed above is a mere example and that other cleaning techniques may be used that include some or all of steps disclosed herein. Following the cleaning 450, the inspection structure of the mask may be re-inspected as was discussed in block 420 to determine the contamination status of the mask.

Thus, the present disclosure provides a photomask that includes a transparent substrate, a mask pattern formed on a first area of the substrate, the mask pattern having one or more openings that allow light radiation to pass through and having one or more features formed of a first material, and an inspection structure formed on a second area of the substrate different from the first area, the inspection structure being formed of a second material different from the first material. In some embodiments, the second material includes a hydrophilic material. In some other embodiments, the second material includes a porous carbon material. In other embodiments, the second material includes titanium dioxide ($TiO_2$). In still other embodiments, the second material includes silver. In other embodiments, the first material includes one of chromium (Cr) and a metal silicide. In still some other embodiments, the inspection structure is configured to determine a contamination status of the photomask.

The present disclosure also provides a method for monitoring a contamination status of a photomask that includes providing a photomask that includes: a transparent substrate, a mask pattern formed on a first area of the substrate, the mask pattern having one or more openings that allow light radiation to pass through and having features formed of a first material, and an inspection structure formed on a second area of the substrate different from the first area, the inspection structure being of a second material different from the first material; inspecting the inspection structure to determine whether there is a precipitate proximate to or in contact with the inspection structure; and cleaning the photomask if it is determined that there is the precipitate proximate to or in contact with the inspection structure. In some embodiments, the second material includes one of a hydrophilic material, a porous carbon material, silver, titanium dioxide ($TiO_2$), and combinations thereof.

In other embodiments, the first material includes one of chromium (Cr) and a metal silicide. In some other embodiments, the step of inspecting is performed without inspecting the mask pattern in the first area. In still other embodiments, the step of inspecting is performed by an optical microscope. In other embodiments, the method further includes performing a photolithography process with the photomask to pattern a semiconductor wafer if it is determined that there is no precipitate proximate to or in contact with the inspection structure. In some other embodiments, the method further includes re-inspecting the inspection structure after cleaning the photomask.

Further, the present disclosure provides a photomask that includes a transparent substrate, an absorption layer formed on the substrate and having a pattern to be transferred onto a semiconductor wafer, and a reference structure formed on the substrate and formed of a material different from the absorption layer, the reference structure being associated with a determination of a contamination status of the photomask. In some embodiments, the reference structure includes one of a hydrophilic material, a porous carbon material, a silver, a titanium dioxide, and combinations thereof. In other embodiments, the absorption layer includes one of chromium and a metal silicide. In some other embodiments, the transparent substrate includes one of a fused silica, a fused quartz, a glass, and carbon fluoride ($CaF_2$). In still other embodiments, the reference structure is located outside of an area of the pattern of the absorption layer. In other embodiments, the photomask further includes a frame coupled to the substrate, and a pellicle coupled to the frame, where the absorption layer and reference structure are located within a region enclosed by the frame and pellicle.

Although embodiments of the present disclosure have been described in detail, those skilled in the art should understand that they can make various changes, substitutions, and alterations herein without departing from the spirit and scope of the present disclosure. For example, various processing steps of the described methods may be executed in a different order or executed sequentially, combined, further divided, replaced with alternate steps, or removed entirely. Furthermore, various functions illustrated in the methods or described elsewhere in the disclosure may be combined to provide additional and/or alternate functions. Accordingly, all such modifications are intended to be included within the scope of this disclosure.

Several different advantages exist from these and other embodiments. In addition to providing efficient and cost-effective photomasks and methods for monitoring a contamination status of photomasks or reticles in semiconductor manufacture, the photomasks and methods disclosed herein may be implemented with current semiconductor manufacturing and inspecting equipment without added complexity. Also, the photomasks and methods disclosed herein decrease the amount of time required to inspect a single photomask or reticle, and thus the number of photomask that can be inspected daily is greatly increased as well as the frequency at which the same photomask can be inspected. Furthermore, early detection of contamination of photomasks or reticles can be achieved with the embodiments disclosed herein thereby increasing the photomask life time productivity and decreasing the number of photomasks that are required to be reworked due to contamination issues.

What is claimed is:

1. A photomask, comprising:
a transparent substrate;
a mask pattern to be transferred onto a semiconductor wafer formed on a first area of the substrate, the mask pattern having one or more openings that allow light radiation to pass through and having one or more features formed of a first material; and
an inspection structure formed on a second area of the substrate different from the first area, the inspection structure being formed of a second, hydrophilic material different from the first material;
wherein the second area of the substrate is positioned so that it is not transferred when the mask pattern on the first area of the substrate is transferred onto the semiconductor wafer.

2. The photomask of claim 1, wherein the second material includes a porous carbon material.

3. The photomask of claim 1, wherein the second material includes titanium dioxide ($TiO_2$).

4. The photomask of claim 1, wherein the second material includes silver.

5. The photomask of claim 1, wherein the first material is one of chromium and a metal silicide.

6. The photomask of claim 1, wherein the inspection structure is configured to determine a contamination status of the photomask.

7. A method for monitoring a contamination status of a photomask, the method comprising:
providing a photomask that includes:
a substrate;
a mask pattern to be transferred onto a semiconductor wafer formed directly on a first area of the substrate, the mask pattern having one or more openings that allow light radiation to pass through and having features formed of a first material; and
an inspection structure formed directly on a second area of the substrate different from the first area, the inspection structure being of a second material different from the first material and being positioned so that the inspection structure is not transferred when the mask pattern is transferred onto the semiconductor wafer;
inspecting the inspection structure to determine whether there is a precipitate proximate to or in contact with the inspection structure; and
cleaning the photomask if it is determined that there is the precipitate proximate to or in contact with the inspection structure.

8. The method of claim 7, wherein the second material includes one of a hydrophilic material, a porous carbon material, silver, titanium dioxide ($TiO_2$), and combinations thereof.

9. The method of claim 7, wherein the first material includes one of chromium (Cr) and a metal silicide.

10. The method of claim 7, wherein the inspecting is performed without inspecting the mask pattern in the first area.

11. The method of claim 7, wherein the inspecting is performed by an optical microscope.

12. The method of claim 7, including performing a photolithography process with the photomask to pattern a semiconductor wafer if it is determined that there is no precipitate proximate to or in contact with the inspection structure.

13. The method of claim 7, including re-inspecting the inspection structure after cleaning the photomask.

14. A photomask, comprising:
a transparent substrate;
an absorption layer formed on the substrate and having a pattern to be transferred onto a semiconductor wafer; and
a reference structure formed on the substrate and formed of a material different from the absorption layer, the reference structure being associated with a determination of a contamination status of the photomask and being positioned on the photomask so that the reference structure is not transferred when the pattern is transferred.

15. The photomask of claim 14, wherein the reference structure includes one of a hydrophilic material, a porous carbon material, a silver, a titanium dioxide, and combinations thereof.

16. The photomask of claim 5, wherein the absorption layer includes one of chromium and a metal silicide.

17. The photomask of claim 16, wherein the transparent substrate includes one of a fused silica, a fused quartz, a glass, and carbon fluoride ($CaF_2$).

18. The photomask of claim 14, wherein the reference structure is located outside of an area of the pattern of the absorption layer.

19. The photomask of claim 14, further comprising:
a frame coupled to the substrate; and
a pellicle coupled to the frame;
wherein the absorption layer and reference structure are located within a region enclosed by the frame and pellicle.

* * * * *